OPTO-ELECTRONIC TRANSISTOR WITH A BASE-COLLECTOR JUNCTION SPACED FROM THE MATERIAL HETEROJUNCTION
Filed Aug. 13, 1965 2 Sheets-Sheet 1

INVENTOR.
PETER C. NEWMAN
BY
Frank R. Jifani
AGENT

Jan. 9, 1968 P. C. NEWMAN 3,363,155

OPTO-ELECTRONIC TRANSISTOR WITH A BASE-COLLECTOR JUNCTION SPACED FROM THE MATERIAL HETEROJUNCTION

Filed Aug. 13, 1965 2 Sheets-Sheet 2

INVENTOR.
PETER C. NEWMAN

BY Frank R. Trifari

AGENT 3,363,155

OPTO-ELECTRONIC TRANSISTOR WITH A BASE-COLLECTOR JUNCTION SPACED FROM THE MATERIAL HETEROJUNCTION

Peter Colin Newman, Three Bridges, Crawley, England, assignor to North American Philips Company, Inc., New York, N.Y., a corporation of Delaware Filed Aug. 13, 1965, Ser. No. 479,546
Claims priority, application Great Britain, Aug. 19, 1964, 33,876/64
7 Claims. (Cl. 317—235)

This invention relates to opto-electronic semiconductor devices.

In co-pending patent application Ser. No. 336,336, filed Dec. 19, 1963, now abandoned, whose contents are hereby incorporated by reference there is described and claimed an opto-electronic semiconductor device comprising a semiconductor body having a first, photon-emissive p-n junction capable of emitting photons with a quantum efficiency greater than 0.1 when suitably biased in the forward direction and a photo-sensitive part comprising a second, photo-sensitive p-n junction for transforming the energy of photons emanating from the first p-n junction to that of charge carriers when the second p-n junction is suitably biased in the reverse direction, the distance between the first p-n junction and the second p-n junction being at least one diffusion length from the first p-n junction of the charge carriers injected by that junction into the adjacent region of the body intermediate the first and second junctions. Such a device will hereinafter be referred to as an opto-electronic transistor. The regions of the body will be given the terms normally associated therewith in the transistor art. Thus, the region of the body intermediate the first and second junctions will be hereinafter referred to as the base region. The first junction will hereinafter be referred to as the emitter-base junction separating the base region from the emitter region and the second junction will be hereinafter referred to as the collector-base junction separating the base region from the collector region.

An opto-electronic transistor may generally have a PNP or NPN structure with a single connection to the region of the body intermediate the first and second junctions, but in certain instances the structure may be such that more than one connection is made to the region of the body intermediate the first and second junctions, for example, when the intermediate region comprises a high resistivity part serving to electrically isolate the junctions. The principle of small signal operation of a p-n-p opto-electronic transistor is as follows.

The emitter-base junction is forward biased to obtain a region of excess carrier concentration each side of this junction. The semiconductor material and impurity content are chosen such that a large proportion of the hole-electron pairs recombine with the emission of photons.

The collector-base junction is reverse biased to obtain a depletion region. Hole-electron pairs are liberated in the depletion region by the photons emitted from the first junction which reach the depletion region and the hole-electron pairs are rapidly separated by the field, the holes flowing to the collector and the electrons to the base.

The input signal modulates the emitter-base current. This change in current produces a change in the number of photons emitted. The change in collector-base current follows the change in emitter-base current and the $\alpha o$ of the opto-electronic transistor may approach unity if certain conditions are satisfied. Most of the photons emitted should reach the depletion region of the collector-base junction and be absorbed therein and converted into current with a quantum efficiency approaching unity.

The semiconductor material of the base region must be chosen to have a low absorption constant for the emitted photons and its thickness made significantly less than one absorption length. The semiconductor material and impurity concentration of the collector region must be chosen such that the emitted photons have an absorption length which is less than the width of the depletion region of the collector-base junction. In order to achieve this a change in the absorption constant in the semiconductor material is required in the region of the body in which collection of the photons occurs and to this end it has hitherto been proposed to make the collector-base junction a heterojunction between the base region of a first semiconductor material and a collector region of a second semiconductor material having a lower energy gap than the first semiconductor material. For example, the collector-base junction may be between a p-type germanium collector region and an n-type gallium arsenide base region, the p-type emitter region also being of gallium arsenide. The absorption length of the main maximum of the light emitted by the forward biased emitter-base junction in the gallium arsenide part is about 1,000$\mu$ whereas the absorption length in the germanium collector region is about 0.3$\mu$. The lattice constant of germanium practically matches that of gallium arsonide and base-collector heterojunctions have been prepared by epitaxial deposition of a collector region of germanium on a base region of gallium arsenide.

According to the invention an opto-electronic transistor comprises a semiconductor body having a first portion of a first semiconductor material and a second portion of a second semiconductor material of lower energy gap than the first semiconductor material, an emitter region lying wholly within the first portion, a collector region lying wholly within the second portion and a base region lying predominantly within the first portion such that the collector-base junction lies within the second portion spaced from the boundary between the first and second portions.

The advantage of such an arrangement is, inter alia, that since the collector-base junction lies within the second portion of the body which is of lower energy gap material more efficient collection of photons and consequent generation of electron-hole pairs can be obtained as the depletion region of the junction will lie in the portion of lower energy gap material not only on the collector side of the junction but also at least partly on the base side of the junction. The width of the depletion region is dependent upon the impurity concentration of the semiconductor material. Since the collector-base junction lies wholly within the lower energy gap material and the impurity concentration in this portion of the body will generally be significantly less than in the adjacent material of higher energy gap in which the base region predominantly lies, the available depletion layer width is increased which leads to more efficient collection of photons.

In an opto-electronic transistor according to the invention the collector-base junction may be spaced from the boundary between the first and second portions by a distance such that when a reverse voltage suitable for operation of the transistor is applied across the collector-base junction the depletion region of this junction lies substantially wholly within the second portion of the semiconductor body. With such an arrangement the available depletion region width may be made to be as large as possible. There should be no region in the lower energy gap material between the collector-base junction and the boundary between the first and second portions in which the depletion region is not present and preferably the extremity of the depletion region on the base side of the collector-base junction should correspond with the boundary between the first and second portions.

Consequently, in a preferred embodiment of the opto-electronic transistor according to the invention the collector-base junction is spaced from the boundary between the first and second portions by a distance within reach of the depletion layer of the collector-base junction under a reverse voltage. This means, that it is possible to apply a reverse bias to the collector-base junction such that the depletion layer reaches the boundary without danger of entering the avalanche breakdown-region of said junction.

In a further preferred embodiment of the opto-electronic transistor the collector-base junction is spaced from the boundary between the first and second portions by a distance such that under operating conditions the depletion layer of the collector-base junction extends practically to the boundary. In this embodiment, therefore, the reverse voltage which is applied to the collector-base junction in operating condition is such that the edge of the corresponding depletion layer practically coincides with the boundary between the first and second portions.

In order to collect most of the light the highly absorbing part of the depletion layer of the collector-base junction should have a width greater than three absorption lengths.

It was calculated that at three absorption lengths already 95%, at 4 absorption lengths 98% and at 5 absorption lengths 99.4% of the collected photons are absorbed. A greater width of the depletion layer might lead to increase of transit time of the hole-electron pairs.

Accordingly, in another preferred embodiment of the opto-electronic transistor the doping of the material with the lower energy gap and the reverse voltage over the collector-base junction are so chosen, that the width of the collector-base depletion layer is greater than about three absorption lengths of the main maximum of the light emitted by the emitter-base junction.

In a further preferred embodiment of the opto-electronic transistor according to the invention, the doping of the material with the lower energy gap and the reverse voltage over the collector-base junction are so chosen, that the width of the collector-base depletion layer is not greater than about five absorption lengths of the main maximum of the light emitted by the emitter-base junction.

Due to absorption of photons being arranged to occur totally within the lower energy gap material since the depletion region of the collector-base junction lies substantially wholly within the portion of the lower energy gap material, the necessity of having a high impurity concentration on the base side of the collector-base junction in order to make the depletion region lie almost entirely on the collector side does not arise. Thus the impurity concentration in the adjacent material of higher energy gap in which the base region predominantly lies may be chosen independently of the characteristics required of the collector-base junction.

The collector-base junction may be spaced from the boundary between the first and second portions by a distance which is at least 1 micron, or may be greater than 2 microns, or even may be greater than 3 microns.

The first portion of the semiconductor body may be epitaxial with the second portion of the semiconductor body.

The first portion of the body may consist of a first semiconductor material epitaxially deposited on the second portion consisting of a second semiconductor material of lower energy gap than the first semiconductor material.

The first portion of the body may be epitaxially deposited in a cavity extending into, but not through the second portion of the body.

The first semiconductor material of the first portion may be a III–V semiconductor compound or a substituted III–V semiconductor compound and the second semiconductor material of the second portion may be a III–V semiconductor compound or substituted III–V semiconductor compound.

Reference to a III–V semiconductor compound is to be understood to mean a compound between substantially equal atomic amounts of an element of the class consisting of boron, aluminum, gallium and indium of Group III of the Perodic Table and an element of the class consisting of nitrogen, phosphorus, arsenic and antimony of Group V of the Perodic Table. Reference to a substituted III–V semiconductor compound is to be understood to mean a III–V semiconductor compound in which some of the atoms of the element of the above class of Group III are replaced by atoms of another element or other elements of the same class and/or some of the atoms of the element of the above class of Group V are replaced by atoms of another element or other elements of the same class.

The first semiconductor material of the first portion may be a II–VI semiconductor compound or a substituted II–VI semiconductor compound and the second semiconductor material of the second portion a II–VI semiconductor compound or a substituted II–VI semiconductor compound.

Reference to a II–VI semiconductor compound is to be understood to mean a compound having semiconductor properties between substantially equal atomic amounts of an element of the class consisting of beryllium, magnesium, zinc, cadmium and mercury of Group II of the Periodic Table and an element of the class consisting of oxygen, sulphur, selenium and tellurium of Group VI of the Periodic Table. Reference to a substituted II–VI semiconductor compound is to be understood to mean a II–VI semiconductor compound in which some of the atoms of the element of the above class of Group II are replaced by atoms of another element or other elements of the same class and/or some of the atoms of the element of the above class of Group VI are replaced by atoms of another element or other elements of the same class.

In one preferred form of the opto-electronic transistor according to the invention the first portion is of gallium arsenophosphide ($GaS_{1-x}P_x$) and the second portion is of gallium arsenide.

In a further preferred form of the opto-electronic transistor according to the invention the first portion is of gallium arsenide and the second portion is of gallium indium arsenide ($Ga_{1-x}In_xAs$).

The location of the collector-base junction spaced from the boundary between the first and second portions may have been determined by a diffusion in the vicinity of the boundary of a conductivity type determining impurity element characteristics of the one type, initially present in the first portion in a substantially uniform concentration, from the first portion into the second portion initially containing a substantially uniform concentration of a conductivity type determining impurity element characteristic of the opposite type and lower than the concentration of the impurity element of the one type in the first portion. The impurity element of the one type must be chosen such that it determines the same conductivity type in both the first and the second semiconductor materials.

In one such opto-electronic transistor the boundary is between a first portion of n-type gallium arseno-phosphide ($GaAs_{1-x}P_x$) initially containing a substantially uniform concentration of a donor element epitaxially deposited on a second portion of gallium arsenide initially containing a substantially uniform concentration of an acceptor element lower than the concentration of the donor element in the first portion and the collector-base junction has been located in the second portion spaced from the boundary by the diffusion of the donor element into the vicinity of the boundary from the first portion into the second portion. The donor element may be tin and the acceptor element may be zinc. One embodiment of the invention will now be described, by way of example, with reference to the accompanying diagrammatic drawings in which:

Figure 1:
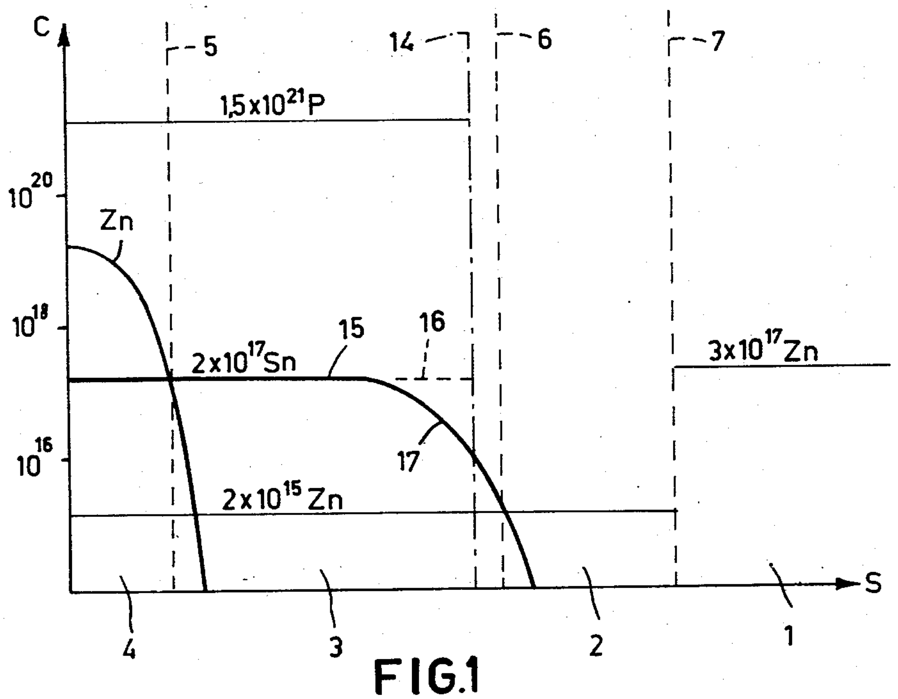
FIGURE 1 is a graph showing the concentration of impurity centres in the semiconductor body of an opto-electronic transistor according to the invention.

In FIGURE 1 the impurity concentrations C are represented as ordinates on a logarithmic scale and the distances S in the semiconductor body are represented as abscissae on a linear scale.

Figure 2:
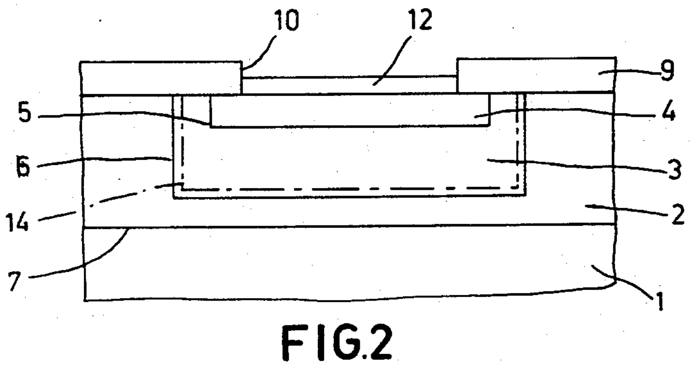
FIGURE 2 is a section through part of the opto-electronic transistor of FIGURE 1 during a stage of manufacture prior to attachment of leads to the various regions of the semiconductor body.
Figure 3:
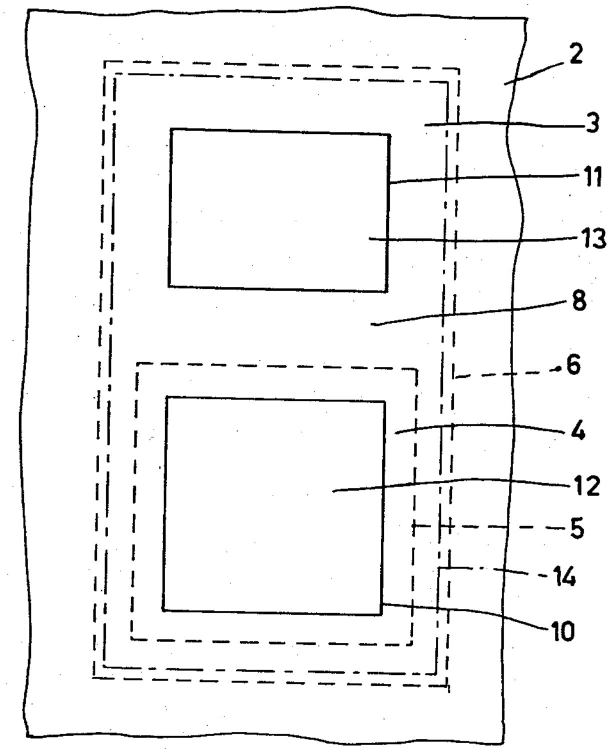
FIGURE 3 is a plan view of the opto-electronic transistor part shown in FIGURE 2.

The opto-electronic transistor of FIGURES 1 to 3 consists of a semiconductor body having a low resistivity $p^+$ substrate 1 of gallium arsenide with a uniform acceptor concentration of zinc of about $3\times10^{17}$ atoms/cc., a higher resistivity p-type collector region 2 of gallium arsenide epitaxially deposited on the substrate 1 and having a uniform acceptor concentration of zinc of $2\times10^{15}$ atoms/cc. a n-type base region 3, a p-type emitter region 4, an emitter-base junction 5 and a collector-base junction 6. The p–n junctions 5 and 6 are represented in FIGURES 1 and 3 by broken lines and the interface between the substrate 1 and the region 2 is represented by a broken line 7 in FIGURE 1. The emitter region 4 and a part of the base region 3 lie within a portion of the semiconductor body of a solid solution of galium arsenide and gallium phosphide, hereinafter referred to as gallium arseno-phosphide. The collector region 2 lies wholly within a portion of the body of gallium arsenide. The portion of the body of gallium areseno-phosphide consists of material epitaxially deposited in a cavity 8 (FIGURE 3) extending into, but not through the portion of gallium arsenide. The interface between the epitaxially deposited gallium arseno-phosphide and the gallium arsenide lying at the extremities of the cavity is shown by the chain dot lines 14. In the epitaxially deposited portion of gallium arseno-phosphide there is a uniform acceptor concentration of $2\times10^{15}$ atoms/cc. of zinc corresponding to the concentration of zinc in the collector region 2. The conductivity type determining impurity element in the base region 3 is tin which is of a concentration of $2\times10^{17}$ atoms/cc. at the emitter-base junction 5 and falls to a concentration of $2\times10^{15}$ atoms/cc. at the collector-base junction 6. The tin is initially present throughout the epitaxially deposited portion of gallium arseno-phosphite in a uniform concentration of $2\times10^{17}$ atoms/cc. as is indicated in FIGURE 1 by the horizontal straight lines 15 and 16 in full and dotted lines respectively but due to a diffusion step in the manufacture of the device subsequent to the epitaxial deposition the tin is diffused beyond the interface 14 to give a diffusion profile as shown by the curved line 17 as a continuation of the line 15. The diffusion is such that the collector-base junction 6 lies spaced about 1 micron from the interface 14 into the gallium arsenide portion of the body. The conductivity type determining impurity element in the emitter region is zinc formed by diffusion therein and having a concentration at the surface of $3\times10^{19}$ atoms/cc., in addition to the background concentration of $2\times10^{15}$ atoms/cc., present throughout the epitaxially deposited portion of gallium arseno-phosphide. The emitter-base junction and the collector-base junction both terminate only in a common plane surface of the regions 2, 3 and 4 of the body and the emitter-base junction is surrounded by the collector-base junction within the semiconductor body. The dimensions of the $p^+$ gallium arsenide substrate are 1 mm. x .3 mm. thickness, the epitaxially deposited collector regions of gallium arsenide has a thickness of about 30μ, the interface 14 between the epitaxially deposited gallium arseno-phosphide and the gallium arsenide is at a depth of about 20μ from the common surface of the body. The collector-base junction 6 in the epitaxially deposited gallium aresenide is spaced about 1μ from the interface 14 and therefore is at a depth of about 21μ from the common place surface. The emitter-base junction 5 is at a depth of about 5μ within the epitaxially deposited gallium arsenide. The area of the major part of the collector-base junction lying parallel to the interface 7 between the collector region 2 and the substrate 1 and parallel to the common plane surface of the regions 2, 3 and 4 in which both junctions terminate is about 112μ x 62μ and the corresponding area of the emitter area of the emitter-base junction is about 50μ x 50μ. The upper common place surface of the body in which the junctions terminate has an insulating masking layer of silicon oxide 9 deposited thereon with two windows 10 and 11 in the layer 9 in which ohmic contacts 12 and 13 to the emitter and base regions respectively are situated.

The opto-electronic transistor shown in FIGURES 1 to 3 is manufactured as follows:

A body of low resistivity single crystal gallium arsenide having zinc as acceptor impurity in a concentration of about $3\times10^{17}$ atoms/cc., in the form of a slice 1 cm. x 1 cm. is lapped to a thickness of .3 mm. to form a substrate 1 and polished so that it has a damage free crystal structure and an optically flat finish on one of its larger surfaces. The starting material being a slice of 1 $cm.^2$ will yield a plurality of the described devices by carrying out subsequent steps in the manufacture using suitable masks such that a plurality of isolated devices are formed in the single slice which are later separated by dicing but the method will now be described with reference to the formation of each isolated device it being assumed that where masking, diffusion, etching and associated steps are referred to then these steps are simultaneously carried out for each isolated device on the single slice prior to dicing.

A layer of p-type gallium arsenide of 30μ thickness is epitaxially grown by deposition from the vapour phase on the prepared surface of the substrate 1 to form a collector region 2. The gallium arsenide layer is formed at 750° C. by the reaction of gallium and arsenic, the gallium being produced by the disproportionation of gallium monochloride and the arsenic being produced by the reduction of arsenic trichloride with hydrogen. Simultaneously with the deposition of the gallium arsenide zinc is deposited such that in the epitaxially grown layer there is a uniform concentration of zinc of $2\times10^{15}$ atoms/cc.

A masking layer of silicon oxide is now grown on the surface of the epitaxially deposited gallium arsenide by the reaction of dry oxygen and tetra-ethyl silicate at a temperature of 350–450° C. The slice is laid horizontally on a pedestal so that no silicon oxide is deposited on the lower surface of the low resistivity substrate.

A photosensitive resist layer is applied to the surface of the silicon oxide masking layer and with the aid of a mask is exposed such that an area of 110μ x 60μ is shielded from the incident radiation. The unexposed part of the resist layer is removed with a developer so that a window 110μ x 60μ is formed in the resist layer. The underlying oxide layer exposed by the window is now etched with a fluid consisting of a solution of 25% ammonium fluoride and 3% hydrofluoric acid in water. Etching is carried out until a window 110μ x 60μ is formed in the oxide masking layer. The photosensitive resist layer is then removed from the remainder of the surface of the oxide layer by softening in trichloroethylene and rubbing. Suitable resist material and developers are known and available commercially.

The body is now etched so that a cavity is formed in the epitaxially deposited gallium arsenide layer 2 at a position corresponding to the window in the oxide layer. Etching is continued until a cavity 8 of 20μ depth in the epitaxially deposited p-type layer is formed. A suitable etchant is 3 parts concentrated $HNO_3$, 2 parts $H_2O$ and 1 part HF (40%) used at 40° C., the etching rate being approximately 1μ/sec. The oxide masking layer is subsequently removed by dissolving in the above described solution of ammonium fluoride and hydrofluoric acid in water. The original surface of the epitaxially deposited gallium arsenide layer 2 now having the 20$\mu$ cavity therein is prepared for further epitaxial deposition by etching briefly in the nitric acid and hydrofluoric acid solution described above but used at room temperature.

The prepared body is placed in a tube and an n-type layer of gallium areseno-phosphide is epitaxially grown on the surface of the previously grown epitaxial layer 2 of gallium arsenide. The gallium arseno-phosphide layer is formed at 750° C. by the reaction of gallium with arsenic and phosphorous. The gallium is produced by the disproportionation of gallium monochloride and the arsenic and phosphorous are produced by the reduction of their trichlorides with hydrogen. The phosphorous content in the epitaxially grown solid solution gallium arseno-phosphide layer is $1.5 \times 10^{21}$ atoms/cc. Simultaneous with the deposition of the gallium arseno-phoshide, tin and zinc are deposited such that in the epitaxially grown layer there is a uniform concentration of tin of $2 \times 10^{17}$ atoms/cc. and a uniform concentration of zinc of $2 \times 10^{15}$ atoms/cc. The epitaxial layer grown follows the contour of the surface and growth is continued until the layer is of such a thickness that the epitaxially grown layer of gallium arseno-phosphide fills the cavity and extends over the region of the cavity a few microns beyond the original surface of the epitaxially deposited gallium arsenide layer 2.

After the epitaxial deposition, the body is removed from the tube and a metal disc coated with dental wax is placed in contact with the reverse side of the body. Material is removed from the exposed surface of the body consisting of the epitaxially deposited layer of gallium arseno-phospide by polishing until the surface becomes flat and lies a few microns below the original surface of the epitaxially grown layer 2 of gallium arsenide. By the use of suitable staining techniques the original surface of the epitaxially grown layer 2 of gallium arsenide may be located and the polishing halted thereafter accordingly. By this removal of the gallium-arseno-phosphide layer there remains a body as is shown in FIGURES 2 and 3 consisting of a p+ substrate having a p-type epitaxial layer 2 of nearly 30$\mu$ thickness with a cavity 8 extending nearly 20$\mu$ from the upper surface into this layer and containing gallium arseno-phosphide 3 epitaxially grown on the gallium arsenide. The interface 14 between the gallium arseno-phosphide and the gallium arsenide corresponds to the extremity of the cavity 8.

The body is given a light cleaning etch in a solution of methanol and bromine before a masking layer of silicon oxide is grown on the whole surface of the body by the reaction of dry oxygen and tetra-ethyl silicate at a temperature of 350–450° C.

The body is placed in a sealed silica tube and heated at 1100° C. for a period of a few minutes in order to allow the tin in the epitaxially deposited gallium arseno-phosphide to diffuse beyond the interface 14 into the underlying gallium arsenide. The diffusion is carried out such that the collector-base junction, where the tin concentration is $2 \times 10^{15}$ atoms/cc. is spaced from the interface 14 by about 1$\mu$ and lies wholly within the portion of the body of gallium arsenide.

The silicon oxide masking layer is now removed from the lower surface of the body, that is the surface of the gallium arsenide substrate 1, as follows:

The upper surface of the body on which the silicon oxide layer is present is coated with a solution of apiezon wax in toluene which is hardened on evaporation of the toluene. The silicon oxide layer on the lower surface of the body is etched away using the above described solution of ammonium fluoride and hydrofluoric acid in water. The apiezon wax on the upper surface is then dissolved in toluene to leave a silicon oxide masking layer 9 only on the upper surface of the body.

A photosensitive resist layer is applied to the surface of the silicon oxide masking layer 9 and with the aid of a mask is exposed such that an area situated above the gallium arseno-phosphide epitaxially deposited in the cavity and of dimensions 40$\mu$ x 10$\mu$ is shielded from the incident radiation. The unexposed part of the layer is removed with a developer so that a window 40$\mu$ x 40$\mu$ is formed in the resist layer. The body is etched to form a window 10 (FIGURE 3) 40$\mu$ x 40$\mu$ in the silicon oxide masking layer 9 at a position below the window in the resist layer. The etchant is the amminium fluoride and hydrofluoric acid solution described above for removing the previously formed silicon oxide masking layer.

The photoresist remaining on the surface of the silicon oxide masking layer 9 is removed by softening in trichloroethylene and rubbing. The body is now placed in a sealed silica tube containing zinc and excess arsenic and phosphorous and zinc is diffused into the gallium arseno-phosphide region 3 by heating the tube to 900–1000° C.

The diffusion of zinc is controlled such that the emitter-base junction of the opto-electronic transistor lies at a distance of 5$\mu$ from the surface of the region 3 where the concentration is $3 \times 10^{19}$ atoms/cc.

Ohmic contact to the p-type emitter region is made by evaporating gold containing 4% zinc over the entire upper surface of the body. The source is held at 800–1,000° C., the body at room temperature and the evaporation is continued for not more than 1 minute, so that a gold 4% zinc contact layer 12 is deposited on the emitter surface in the window 10.

The amount of gold/zinc evaporated over the upper surface is such as to be insufficient to fill the window 10 and the filling is thereafter effected with a protective lacquer of Cerric Resist. The remainder of the gold/zinc on the upper surface of the body is now removed by a solution of 40 g. KI, 10 g. I and 250 g. $H_2O$.

A fresh photosensitive resist layer is applied to the surface and, with the aid of a mask, exposed such that a second area 40$\mu$ x 30$\mu$ situated above the gallium arseno-phosphide epitaxially deposited in the cavity is shielded from the incident radiation. The unexposed part of the photosensitive resist layer is removed so that a further window 40$\mu$ x 30$\mu$ is formed in the resist layer. The body is etched to form a window 11 (FIGURE 3) 40$\mu$ x 30$\mu$ in the silicon oxide masking layer 9 at a position below the window formed in the resist layer. The same etchant is used as is used to form the window 10 in the silicon oxide masking layer. The lacquer of Cerric Resist in the window 10 above the evaporated gold/zinc contact is not attacked by the etchant. The window 11 exposes the base region 3 consisting predominantly of gallium arseno-phosphide and ohmic contact to this region is made by evaporating gold containing 4% tin over the whole upper surface of the body so that a gold 4% tin contact layer 13 is deposited in the window 11 in the silicon oxide layer. The amount of gold/tin evaporated over the upper surface is such as to be insufficient to fill the window 11 and the filling is thereafter effected with a protective lacquer of Cerric Resist. The remainder of this gold/tin layer on the upper surface of the body is removed with the exposed portion of the photosensitive resist layer, by softening this in trichlorethylene and rubbing.

The protective lacquer of Cerric Resist in the windows 10 and 11 above the gold/zinc and gold/tin layers respectively is removed by dissolving in acetone.

The body is placed in a furnace and heated to 500° C. for 5 minutes to alloy the gold/zinc and gold/tin contact layers 12 and 13 respectively to the emitter and base region respectively.

A reflective layer of gold (not shown in the figures) may now be selectively applied to the surface of the oxide layer to form a mirror at the periphery of the emitter-base junction. This may be carried out by applying a photosensitive resist layer to the entire surface and, with the aid of a mask, exposing the resist layer so that a narrow strip above the periphery of the emitter-base junction is shielded from the incident radiation. The unexposed part of the photosensitive resist layer is removed so that a window corresponding to the narrow strip is formed in the resist layer. Gold is then evaporated over the entire upper surface of the body so that in the window formed in the resist layer a reflective gold layer is deposited on the silicon oxide layer. The evaporated gold on the remainder of the surface is then removed with the exposed portion of the photosensitive resist layer by softening this in trichloroethylene and rubbing.

The slice is now diced up into individual pieces 1 mm. x 1 mm. each comprising an opto-electronic transistor assembly. A molybdenum strip is soldered to the *p* substrate 1 with bismuth/2% silver alloy or a bismuth/5% cadmium alloy.

Leads are then secured to the gold and tin contacts 12 and 13 to the emitter and base regions respectively by thermo-compressing bonding gold wires thereto. The assembly with leads so attached is then given a final etch in the fluid of 3 parts concentrated $HNO_3$, 2 parts $H_2O$ and 1 part HF(40%) used at room temperature. The assembly is then encapsulated as is desired.

It will be appreciated that many other embodiments of the opto-electronic transistor according to the invention can be realised. Thus the material of higher energy gap of the first portion need not be epitaxially deposited in a cavity extending into the material of lower energy gap of the second portion although this method of manufacture yields a particularly efficient device, for example, the epitaxial deposition of the material of higher energy gap may be onto a plane surface of a body of lower energy gap material. Furthermore the material of the higher energy gap of the first portion can be formed by methods other than epitaxial deposition, for example, a first portion of the semiconductor body may consist of gallium arseno-phosphide and the second portion of the semiconductor body may consist of gallium arsenide, the portion of gallium arseno-phosphide having been formed by diffusion of phosphorous into a gallium arsenide body in which the second portion is present. When the device is of this form then strict control of the diffusion of the conductivity type determining impurity element in the base region, for example, tin, is required in order that the collector-base junction shall be located spaced from the boundary between the two portions of semiconductor material of different energy gap.

In the embodiment described the acceptor concentration in the substrate is $3\times10^{17}$ atoms/cc. and the acceptor concentration at the surface of the emitter region is $3\times10^{19}$ atoms/cc. In order to keep the absorption of photons as low as possible in the emitter region the concentration at the surface of the region is preferably lower for example, $3\times10^{17}$ atoms/cc. of zinc. However in order to prevent unwanted diffusion of the acceptor element present in the substrate during diffusion and epitaxial deposition it is preferable that the acceptor concentration in the substrate should not be higher than that to be finally obtained at the surface of the emitter region. This particularly applies when the acceptor element in the substrate is the same as the element diffused to form the emitter region. Another possible method of preventing unwanted diffusion and yet maintaining a higher acceptor concentration in the substrate is to use an element having a slower diffusion coefficient, such as for example, manganese as the conductivity determining impurity element in the substrate.

What is claimed is:

1. An opto-electronic device comprising a semiconductor body having emitter, base and collector regions, said emitter and base regions and said base and collector regions forming respectively photon-emitting and photon-collecting, spaced, p-n junctions, said photon-emitting junction being operable when biased in the forward direction to emit photons with a quantum efficiency greater than 0.1, means for biasing said photon-emitting junction in the forward direction to cause the emission of photons toward the photon-collecting junction, and means for biasing said photon-collecting junction in the reverse direction to establish in a body portion adjacent the photon-collecting junction a depletion field for collecting charge carriers generated upon absorption within the body of the emitted photons, the spacing between the photon-emitting and photon-collecting junctions being at least one diffusion length at operating temperatures for charge carriers injected by the photon-emitting junction into the semiconductor body regions lying intermediate the junctions, said semiconductor body having at least two contiguous portions of semiconductor material of different composition possessing different optical energy gaps and including a first material portion of high energy gap and a second material portion of energy gap lower than that of said first material portion, the emitter region lying wholly within the first portion of higher energy gap, the collector region lying wholly within the second portion of lower energy gap, the base region lying predominantly in the first portion but extending into the second portion such that the photon-collecting junction lies wholly within the second portion of lower energy gap and spaced from the boundary of the first and second portions, whereby the depletion field extending from the photon-collecting junction is located predominantly in the second portion of lower energy gap exhibiting improved absorption for the higher energy photons generated by the photon-emitting junction.

2. An opto-electronic device as set forth in claim 1 wherein the spacing of the photon-collecting junction from the boundary of the first and second portions is so large that the depletion region lies wholly within the said second portion.

3. An opto-electronic device as set forth in claim 1 wherein the spacing between the photon-collecting junction and the said boundary is at least one micron.

4. An opto-electronic device comprising a mono-crystalline semiconductor body having emitter, base and collector regions, said emitter and base regions and said base and collector regions forming respectively photon-emitting and photon-collecting, spaced, p-n junctions, said photon-emitting junction being operable when biased in the forward direction to emit photons with a quantum efficiency greater than 0.1, means for biasing said photon-emitting junction in the forward direction to cause the emission of photons toward the photon-collecting junction, and means for biasing said photon-collecting junction in the reverse direction to establish in a body portion adjacent the photon-collecting junction a depletion field for collecting charge carriers generated upon absorption within the body of the emitted photons, the spacing between the photon-emitting and photon-collecting junctions being at least one diffusion length at operating temperature for charge carriers injected by the photon-emitting junction into the semiconductor body regions lying intermediate the junctions, said semiconductor body having at least two contiguous portions of semiconductor material of different composition possessing different optical energy gaps and epitaxially related to one another and including a first material portion of high energy gap and a second material portion of energy gap lower than that of said first material portion, the emitter region lying wholly within the first portion of higher energy gap, the collector region lying wholly within the second portion of lower energy gap, the base region lying predominantly in the first portion but extending into the second portion such that the photon-collecting junction lies wholly within the second portion of lower energy gap and spaced from the boundary of the first and second portions, whereby the depletion field extending from the photon-collecting junction is located predominantly in the second portion of lower energy gap exhibiting improved absorption for the higher energy photons generated by the photon-emitting junction, said first and second portions being constituted of a III–V semiconductor compound.

5. An opto-electronic device as set forth in claim 4 wherein the first portion is of $GaAs_{1-x}P_x$ and the second portion is of GaAs.

6. An opto-electronic device as set forth in claim 4 wherein the first portion is of GaAs and the second portion is of $Ga_{1-x}In_xAs$.

7. An opto-electronic device as set forth in claim 4 wherein the first portion comprises a generally cylindrical body epitaxially deposited within a cavity in the second portion.

References Cited

UNITED STATES PATENTS

| | | | |
|---|---|---|---|
| 3,229,104 | 1/1966 | Rutz | 250—211 |
| 3,082,283 | 3/1963 | Anderson | 136—89 |
| 3,249,473 | 5/1966 | Holonyak | 148—175 |

JOHN W. HUCKERT, *Primary Examiner.*

M. H. EDLOW, *Assistant Examiner.*